United States Patent [19]
Iwata

[11] Patent Number: 5,898,190
[45] Date of Patent: Apr. 27, 1999

[54] P-TYPE ELECTRODE STRUCTURE AND A SEMICONDUCTOR LIGHT EMITTING ELEMENT USING THE SAME STRUCTURE

[75] Inventor: Hiroshi Iwata, Tokyo, Japan

[73] Assignee: NEC Corporation, Tokyo, Japan

[21] Appl. No.: 08/933,031

[22] Filed: Sep. 18, 1997

[30] Foreign Application Priority Data

Sep. 18, 1996 [JP] Japan .................................. 8-246626

[51] Int. Cl.⁶ .................................................. H01L 29/45
[52] U.S. Cl. ........................... 257/99; 257/745; 257/744; 257/103; 257/94; 257/200
[58] Field of Search ................................... 257/744, 745, 257/741, 99, 103, 200, 94

[56] References Cited

U.S. PATENT DOCUMENTS 5,286,306  2/1994  Menezes .................................. 136/249

OTHER PUBLICATIONS

"Graded band gap ohmic contact to p–ZnSe", *Applied Physics Letters*, vol. 61, 1992, pp. 3160–3162.

by S. Tangiguchi et al., "100h II–VI Blue–green laser diode", *Electronics Letters*, vol. 32, No. 6, Mar. 1996, pp. 552 and 553.

*Primary Examiner*—John Guay
*Attorney, Agent, or Firm*—Young & Thompson

[57] ABSTRACT

A p-type electrode structure having low resistance and a high yield light emitting element operable at low operating voltage is disclosed. On a substrate is formed an n-type clad layer, an active layer, a p-type semiconductor layer, a current structure layer, an n-type semiconductor layer and a metal layer. The energy level of a conduction band edge of the n-type semiconductor layer is deeper than that of a valence band edge of the p-type semiconductor layer, and the Fermi level of the metal layer is shallower than the energy level of a conduction band edge of the n-type semiconductor layer.

37 Claims, 5 Drawing Sheets

P-TYPE ELECTRODE STRUCTURE AND A SEMICONDUCTOR LIGHT EMITTING ELEMENT USING THE SAME STRUCTURE

BACKGROUND OF THE INVENTION

1. Field of the Invention

The present invention relates to a p-type electrode structure and a semiconductor light emitting element using the same structure. In detail, the present invention relates to a p-type electrode structure for a wide gap semiconductor and a semiconductor light emitting element using the same structure.

2. Related Art Description

In general, an electrode for a p-type semiconductor is formed of a metal such as Au or Al and is provided as an ohmic electrode by alloying it. In a wide gap semiconductor, it is difficult to obtain an ohmic p-type electrode. In p-type GaN, NiAu is used as an electrode material in order to reduce a resistance thereof. In p-type ZnSe, an electrode structure in which a ZnSe/ZnTe superlattice layer 92 is inserted in between an Au electrode 91 and a p-type ZnSe layer 93 as shown in FIG. 9 is used for a semiconductor laser (cf. Applied Physics Letters, Vol. 61, 1992, pp. 3160–3162) to substantially reduce an operating voltage of the semiconductor laser (cf. Electronics Letters, Vol. 36, 1996, pp. 552).

In a wide gap semiconductor such as the above-mentioned Zn Se or GaN, however, there is a problem that a metal electrode provided on a p-type semiconductor becomes a Schottky type electrode and a resistance of the electrode becomes high. Further, in the electrode structure in which the above-mentioned superlattice is inserted between the metal electrode and the p-type semiconductor layer, there is a problem of reproducibility since a resistance of the electrode is substantially changed by a very small variation of a thickness of the superlattice layer.

There is a further problem that, in the above-mentioned semiconductor laser in which p-type ZnSSe or p-type MgZnSSe is used as a p-type clad layer, a resistance of such wide gap material is high and, thus, an operating voltage of the semiconductor laser becomes high.

SUMMARY OF THE INVENTION

The present invention was made in view of these problems and has an object to provide a p-type electrode structure having a small resistance and to provide a semiconductor light emitting element having a low operating voltage.

In order to achieve the above object, according to the present invention, a p-type electrode structure having a p-type semiconductor layer is featured by comprising an n-type semiconductor layer and a metal layer on the p-type semiconductor layer, wherein an energy level of a conduction band edge of the n-type semiconductor layer is deeper than that of a valence band edge of the p-type semiconductor layer and the structure is operated by injecting current from the metal layer through the n-type semiconductor layer to the p-type semiconductor layer.

Further, according to the present invention, a semiconductor light emitting element is provided which is featured by comprising the p-type electrode structure.

Preferably, the semiconductor light emitting element is a semiconductor laser or light emitting diode having a p-n junction.

Preferably, the semiconductor laser or light emitting diode further includes an active layer and an n-type clad layer. The p-type semiconductor layer, the n-type semiconductor layer and the metal layer are formed adjacent to the active layer. The band gap of the p-type semiconductor layer is larger than the band gap of the active layer and the p-type semiconductor layer is thin compared with a wavelength of light emitted. The energy level of a conduction band edge of the n-type semiconductor layer is deeper than that of a valence band edge of the p-type semiconductor layer and refractive index of the n-type semiconductor layer is smaller than that of the active layer, so that light is confined in the active layer by the n-type clad layer and the n-type semiconductor layer. The semiconductor laser or light emitting diode is operated by injecting holes from the metal layer through the n-type semiconductor layer and the p-type semiconductor layer to the active layer by applying a positive potential to the metal layer.

Further, the n-type semiconductor layer of the p-type electrode structure or the semiconductor light emitting element is, preferably, of a metal oxide.

In the n-type electrode structure or the semiconductor light emitting element, the metal oxide is, preferably, ZnO or BeO.

In the p-type electrode structure or the semiconductor light emitting element, the p-type semiconductor layer is of one selected from a group consisting of wide gap group II-VI compound semiconductors, wide gap group III-V compound semiconductors and group IV wide gap semiconductors.

Preferably, the wide gap group II-VI compound semiconductors include ZnSe, ZnSSe and MgSSe, the wide gap group III-V compound semiconductors include GaN, AlGaN, InGaN, InGaP and InAlP and the group IV wide gap semiconductors include SiC and C.

In general, energy level of a valence band edge of the wide gap semiconductor such as ZnSe or GaN is deeper than the Fermi level of a metal. Therefore, when a metal electrode is formed on such p-type semiconductor layer, a Schottky type contact is formed. Although an ohmic contact is obtained by using a metal having Fermi level deeper than the energy level of the valence band edge of the p-type semiconductor, there is no such metal. On the contrary, energy level of a conduction band edge of a semiconductor such as ZnO is deeper than the Fermi level of a metal and high density doping of n-type impurity is possible. In the present invention, the n-type semiconductor layer is inserted between the p-type semiconductor layer and the metal electrode. The p-n junction formed by the use of the n-type semiconductor layer between the p-type semiconductor layer and the metal electrode is different from a usual p-n junction. Since the level of the conduction band edge of the n-type semiconductor layer is deeper than that of the valence band edge of the p-type semiconductor layer, there is no depletion layer formed in the junction portion and the latter does not have diode characteristics. Current flows to the junction portion easily when either a positive voltage or a negative voltage is applied to the n-type semiconductor layer. On the other hand, since the Fermi level of the metal electrode is shallower than energy level of the conduction band edge of the n-type semiconductor layer, the junction between the metal electrode and the n-type semiconductor layer becomes ohmic. As a result, the p-type electrode structure of the present invention has low resistance and is ohmic.

DETAILED DESCRIPTION OF THE PREFERRED EMBODIMENTS

Embodiments of the present invention will be described in detail with reference to the drawings.

Figure 1:
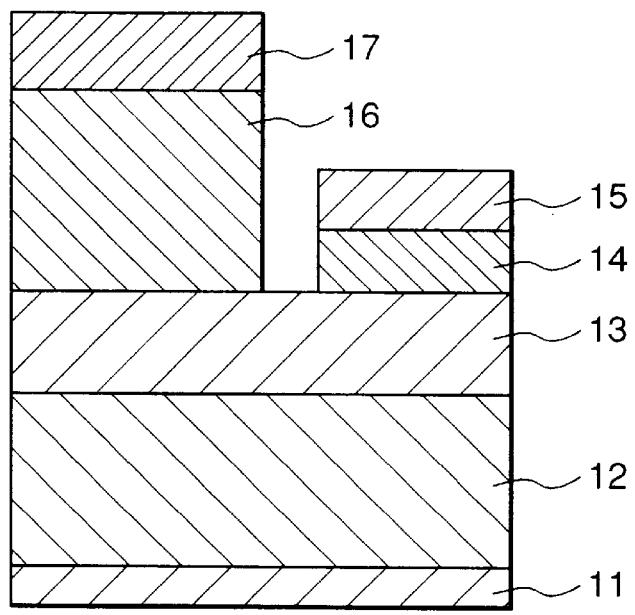
FIG. 1 is a cross sectional view of a first embodiment of the present invention.
Figure 2:
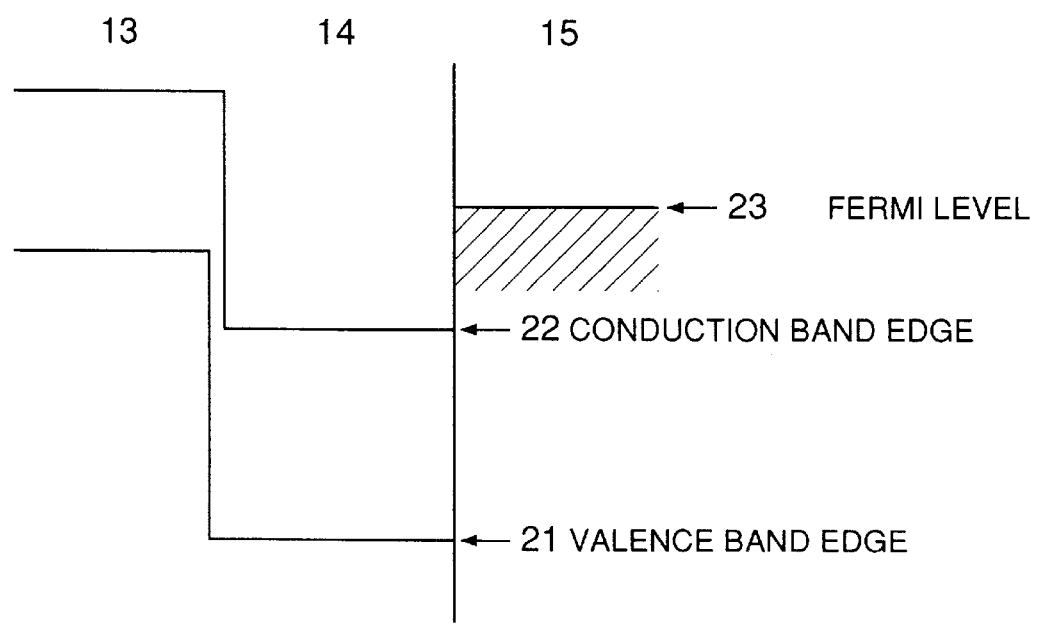
FIG. 2 illustrates energy band of the first embodiment of the present invention.

FIG. 1 is a cross section of a semiconductor light emitting element according to a first embodiment of the present invention and FIG. 2 is a band diagram thereof. This semiconductor light emitting element is a bipolar transistor formed of GaAs semiconductor material, and has a collector 12 and an emitter 16 both of which are formed of n-type GaAs, a base 13 formed of p-type GaAs layer 0.2 $\mu$m thick (doping density being $1 \times 10^{18}$ cm$^{-3}$), a collector electrode 11 and an emitter electrode 17 both of which are formed of AuGeNi. A base electrode comprises an n-type semiconductor layer 14 formed of n-type cadmium oxide, CdO (thickness being 100 nm and doping density being $1 \times 10^{20}$ cm$^{-3}$) and an Au electrode 15. These semiconductor films were formed by metal organic vapor phase epitaxy (MOVPE) and the metal electrodes were formed by high frequency sputtering. The films of the collector electrode 11 and the emitter electrode 17 are alloyed by heating them to 400° C., respectively.

FIG. 2 is an energy diagram of the base 13, the n-type semiconductor layer 14 and the Au electrode 15. The energy level of the valence band edge, the energy level of the conduction band edge and Fermi level are shown by 21, 22 and 23, respectively. The energy level 22 of the conduction band edge of CdO forming the n-type semiconductor layer 14 is deeper than that of the level 21 of the valence band edge of GaAs forming the base 13. Therefore, unlike the usual p-n junction, there is no depletion layer in an interface between the base 13 and the n-type semiconductor layer 14 and the junction does not exhibit diode characteristics and current easily flows from the n-type semiconductor layer 14 to the base 13. Since the Fermi level 23 of the Au electrode 15 is shallower than the level 22 of the conduction band edge of the n-type semiconductor layer 14, a junction between them became ohmic. The electrode resistance of this electrode structure is low and the alloying process by heating is unnecessary. Thus, the reliability of the electrode structure is substantially improved.

Although, in this embodiment, the n-type semiconductor layer is formed of n-type CdO, the n-type semiconductor layer may be formed of other semiconductor material such as n-type ZnO or n-type BeO. Similarly, although the p-type semiconductor layer is formed of p-type GaAs in this embodiment, the p-type semiconductor layer may be formed of other semiconductor material such as p-type ZnSe, p-type SiC or p-type GaN. Further, although the semiconductor element has been described as the bipolar transistor in the above-mentioned embodiment, the semiconductor element may be other semiconductor element such as an FET or a photodiode.

Figure 3:
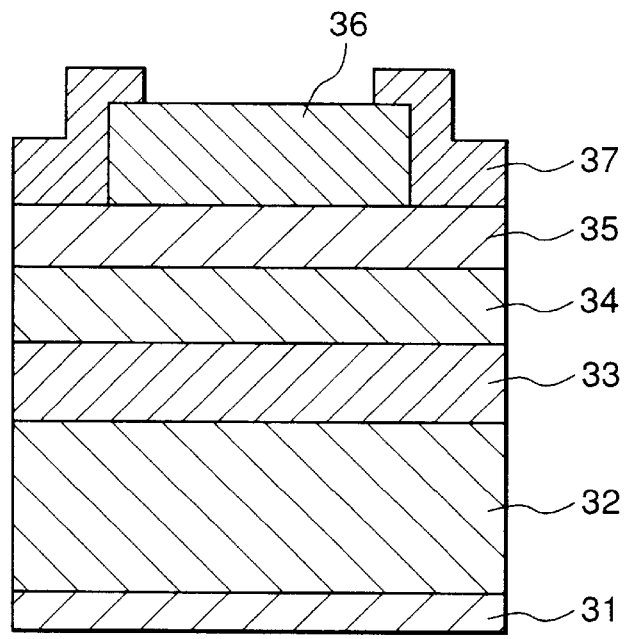
FIG. 3 is a cross sectional view of a second embodiment of the present invention.
Figure 4:
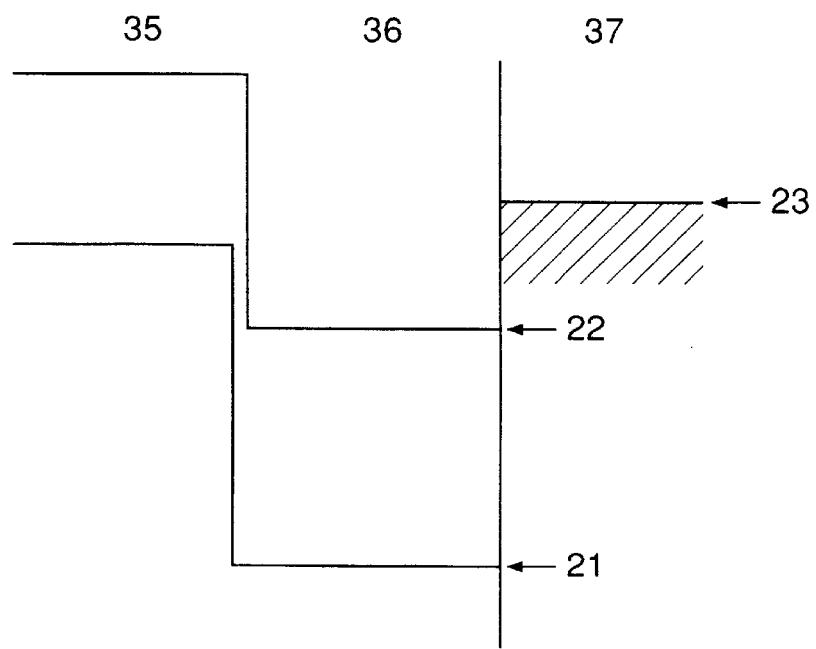
FIG. 4 illustrates energy band of the second embodiment of the present invention.

FIG. 3 is a cross section of a semiconductor light emitting element according to a second embodiment of the present invention, and FIG. 4 is an energy band diagram thereof. This semiconductor light emitting element is a red light emitting diode (LED) which is formed by growing, on a substrate 32 of n-type GaAs semiconductor material, an n-type clad layer 33 of n-type $In_{0.5}$ $(Ga_{0.3}Al_{0.7})_{0.5}P$ (thickness being 0.5 $\mu$m and doping density n=$5 \times 10^{17}$ cm$^{-3}$), an active layer 34 of $In_{0.5}Ga_{0.5}P$ (thickness being 0.2 $\mu$m) and a p-type clad layer 35 of n-type $In_{0.5}$ $(Ga_{0.3}Al_{0.7})_{0.5}P$ (thickness being 0.5 $\mu$m and doping density p=$3 \times 10^{17}$ cm$^{-3}$), by using MOCVD, forming, on the p-type clad layer 35, an n-type semiconductor layer 36 of polycrystalline n-type ZnO (thickness being 1 $\mu$m and doping density n=$5 \times 10^{20}$ cm$^{-3}$) by MOCVD and evaporating thereon a metal layer 37 of Au and an n-type electrode 31 of Au/Ge/Ni.

Electrons and holes are respectively injected from the n-type clad layer 33 and the p-type clad layer 35 to the active layer 34 and light having wavelength of 670 nm is obtained. Since doping density of $In_{0.5}$ $(Ga_{0.3}Al_{0.7})_{0.5}P$ forming the p-type clad layer 35 is low, an electrode resistance of the electrode comprising only metals becomes high. However, by employing the electrode structure composed of the n-type semiconductor layer 36 and the metal layer 37, it is possible to substantially reduced the electrode resistance.

As shown in FIG. 4, energy level 22 of the conduction band edge of ZnO forming the n-type semiconductor layer 36 is deeper than that 21 of the valence band edge of $In_{0.5}$ $(Ga_{0.3}Al_{0.7})_{0.5}P$ forming the p-type clad layer 35. Therefore, there is no depletion layer formed in an interface between the p-type clad layer 35 and the n-type semiconductor layer 36 unlike the usual p-n junction, so that no diode characteristics is given thereto. Current can flow easily from the n-type semiconductor layer 36 to the p-type clad layer 35. Further, since Fermi level 23 of the metal layer 37 is shallower than the level 22 of the conduction band edge of the n-type semiconductor layer 36, a junction between them became ohmic. As a result, the electrode resistance with respect to the p-type clad layer 35 became small.

Further, since the electric resistance of ZnO forming the n-type semiconductor layer 36 is low and ZnO is transparent with respect to wavelength of emitted light, it is possible to inject current to the active layer throughout and to efficiently derive light externally, Further, since the n-type semiconductor layer 36 is polycrystalline and easily fabricated, it is possible to reduce the fabrication cost of the light emitting diode.

Although, in the second embodiment, the n-type semiconductor layer is of n-type ZnO, the n-type semiconductor layer may be formed of other semiconductor material such as n-type BeO. Similarly, although the LED of InGaAlP type has been described as the light emitting element in this embodiment, the light emitting element may be an LED or a semiconductor laser or laser diode (LD) formed of other semiconductor material such as ZnSe or GaN.

Figure 5:
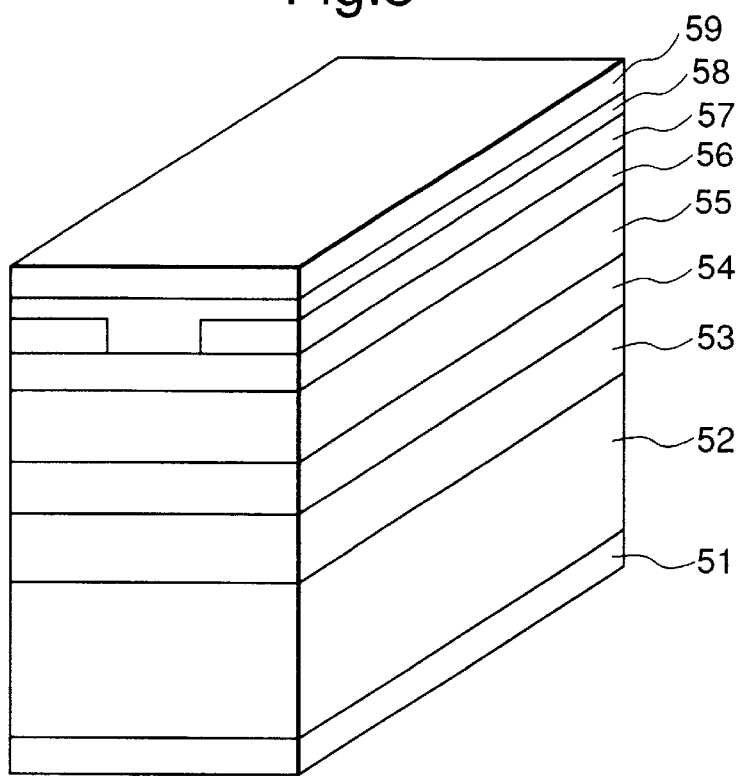
FIG. 5 is a cross sectional view of a third embodiment of the present invention.
Figure 6:
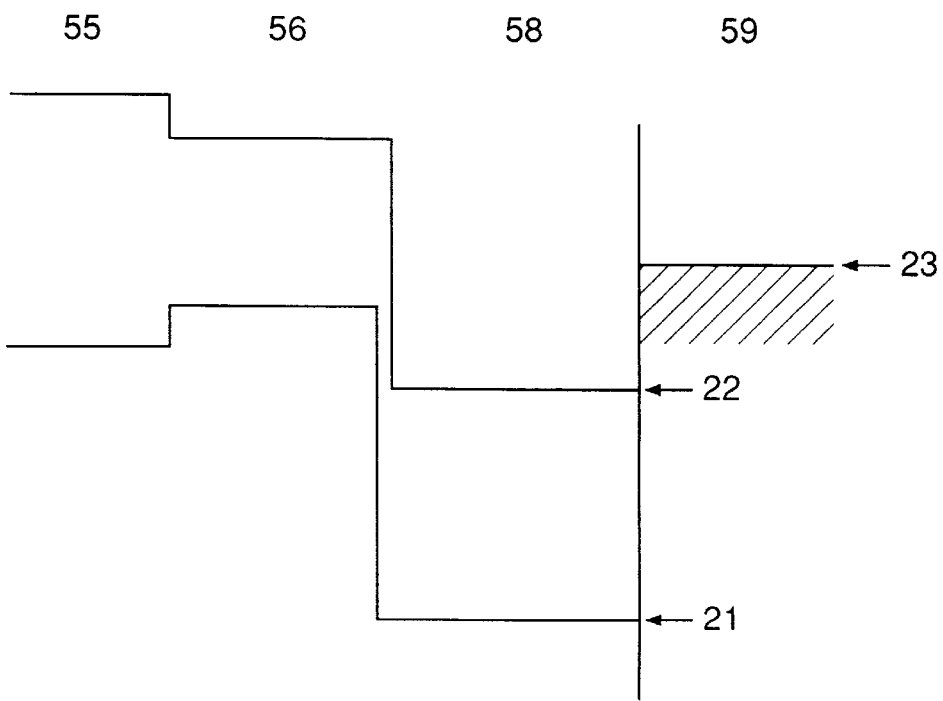
FIG. 6 illustrates energy band of the third embodiment of the present invention.

FIG. 5 is a cross section of a semiconductor light emitting element according to a third embodiment of the present invention and FIG. 6 is a band diagram thereof. This semiconductor light emitting element is a bluish green LD of ZnSe, which is formed by growing, on a substrate 52 of n-type GaAs semiconductor material, an n-type clad layer 53 of n-type $Mg_{0.1}Zn_{0.9}S_{0.15}Se_{0.85}$ (thickness being 1 μm and doping density $n=5\times10^{17}$ cm$^{-3}$), an active layer 54 of ZnSe (thickness being 100 nm), a p-type clad layer 55 of p-type $Mg_{0.1}Zn_{0.9}S_{0.15}Se_{0.85}$ (thickness being 1 μm and doping density $n=5\times10^{18}$ cm$^{-3}$), and a p-type semiconductor layer 56 of p-type ZnSe (thickness being 0.1 μm and doping density $p=1\times10^{18}$ cm$^{-3}$), by using MBE, forming, on the p-type semiconductor layer 56, a current stricture layer 57 of $SiO_2$ by CVD, etching the current stricture layer 57 to a striped pattern, forming, on the current stricture layer 57, an n-type semiconductor layer 58 of polycrystalline n-type ZnO (thickness being 0.2 μm and doping density $n=1\times10^{20}$ cm$^{-3}$) by MBE, evaporating thereon a metal layer 59 of Au and an n-type electrode 51 of Au/Ge/Ni and forming a mirror facet by cleaving.

Electrons and holes are injected from the n-type clad layer 53 and the p-type clad layer 55 to the active layer 54 and a laser light having wavelength of 460 nm is obtained. Since doping density of $Mg_{0.1}Zn_{0.9}S_{0.15}Se_{0.85}$ forming the p-type clad layer 55 can not be increased, the p-type semiconductor layer 56 is inserted as a high density doping layer and, on the p-type semiconductor layer 56, the electrode structure composed of the n-type semiconductor layer 58 and the metal layer 59 is provided to substantially reduce the electrode resistance thereof.

The band energy structure in the electrode portion is shown in FIG. 6. Energy level 22 of the conduction band edge of ZnO forming the n-type semiconductor layer 58 is deeper than that 21 of the valence band edge of ZnSe forming the p-type clad layer 56. Although energy level 21 of the valence band edge of the p-type clad layer 55 is deeper than that of the p-type semiconductor layer 56, a difference therebetween is small and a resistance in a hetero interface between them is small. Therefore, there is no depletion layer formed in an interface between the p-type semiconductor layer 56 and the n-type semiconductor layer 58 unlike the usual p-n junction, so that no diode characteristics is given thereto. Current can flow easily from the n-type semiconductor layer 56 to the p-type semiconductor layer 56. Further, since Fermi level 23 of the metal layer 59 is shallower than the level 22 of the conduction band edge of the n-type semiconductor layer 58, a junction between them is ohmic. As a result, the resistance between the p-type semiconductor layer 56 and the metal layer 59 is small. An operating voltage during a laser oscillation is as good as 5V. Since the n-type semiconductor layer 58 is polycrystalline and easily fabricated, element yield is substantially improved.

Although, in the third embodiment, the n-type semiconductor layer is formed of n-type ZnO, the n-type semiconductor layer may be formed of other semiconductor material such as n type BeO. Similarly, although the LD of ZnSe type has been described as the light emitting element in this embodiment, the light emitting element may be an LED or a LD formed of other semiconductor material such as ZnCdSe or GaN.

Figure 7:
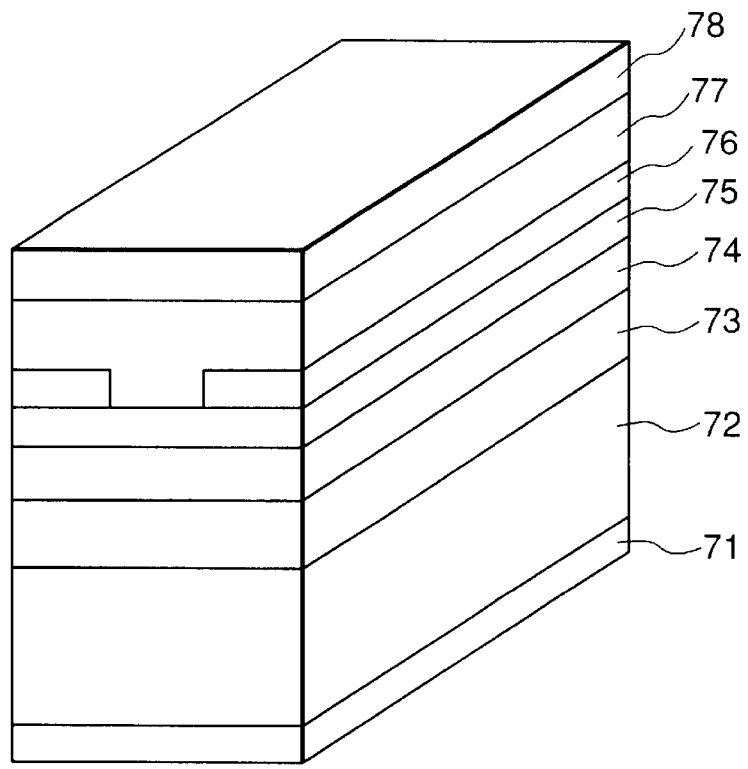
FIG. 7 is a cross-sectional view of a fourth embodiment of the present invention.
Figure 8:
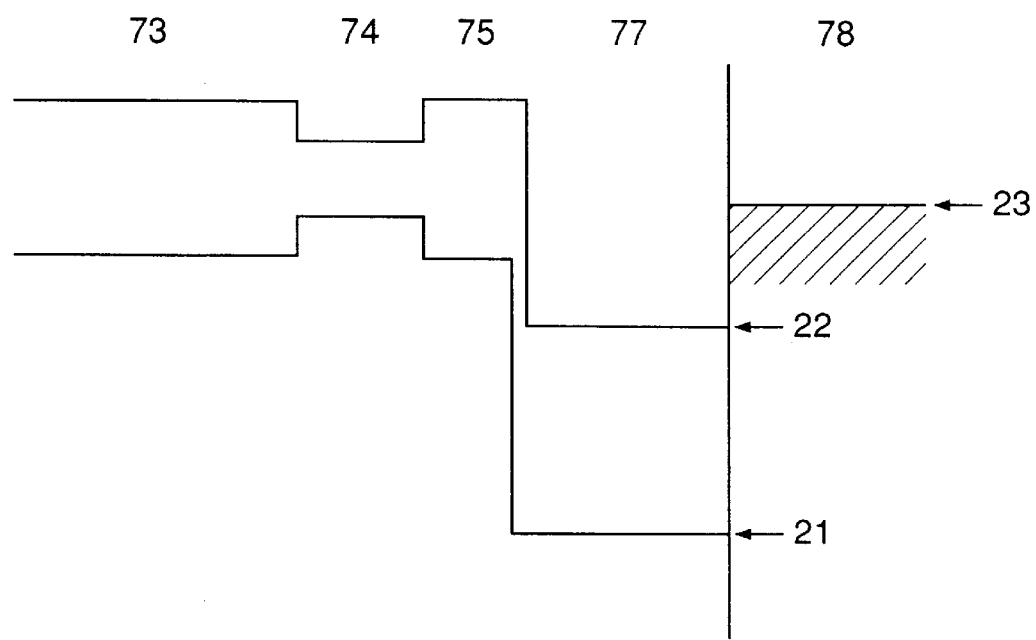
FIG. 8 illustrates energy band of the fourth embodiment of the present invention.
Figure 9:
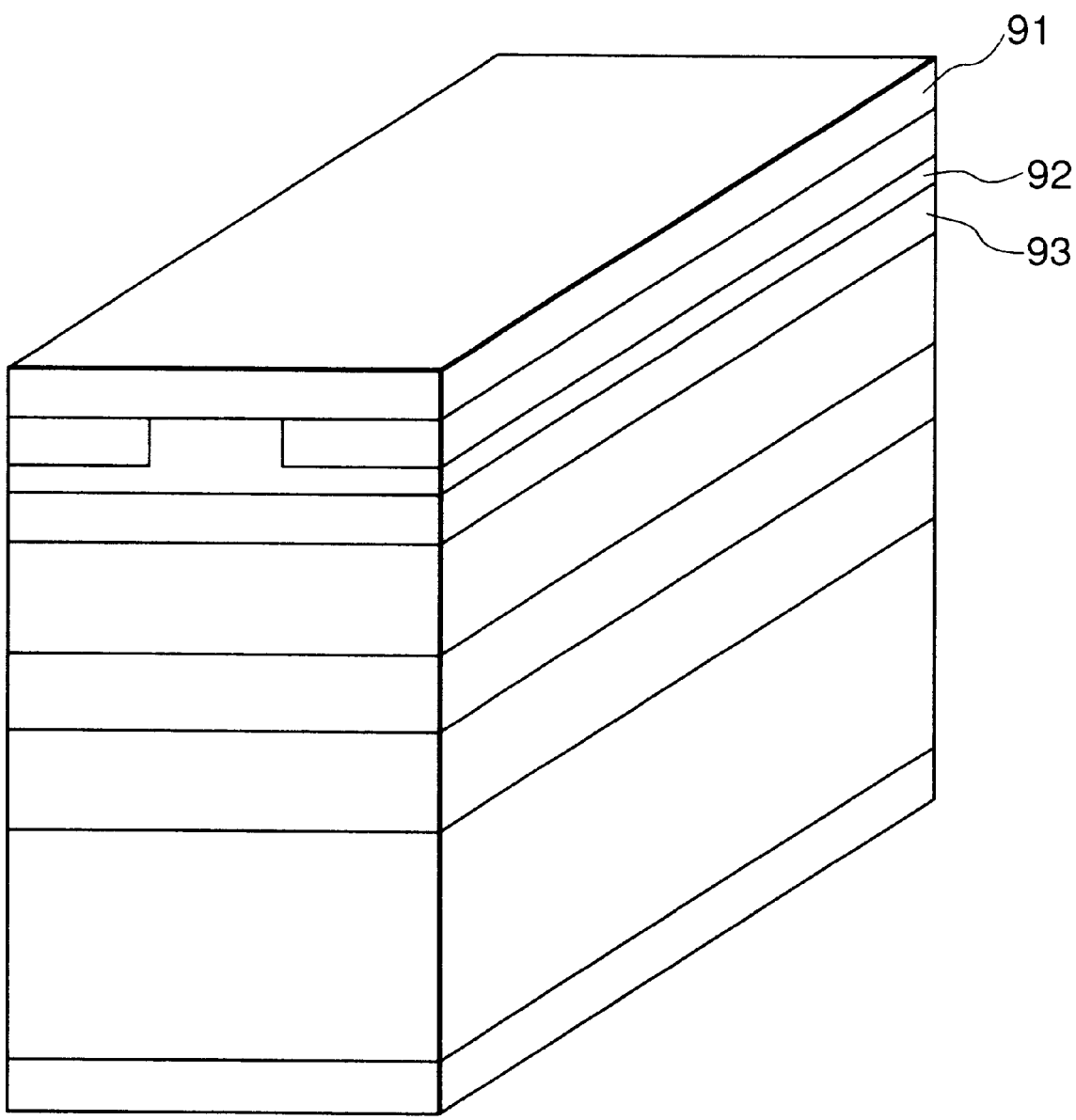
FIG. 9 is a cross sectional view of a conventional structure.

FIG. 7 is a cross section of a semiconductor light emitting element according to a fourth embodiment of the present invention and FIG. 8 is a band diagram thereof. This semiconductor light emitting element is a blue LD of GaN which is formed by growing, on a substrate 72 of n-type SiC semiconductor material, an n-type clad layer 73 of n-type GaN (thickness being 1 μm and doping density $n=5\times10^{17}$ cm$^{-3}$), an active layer 74 in the form of a multiple quantum well (MQW) having 5 layers of $In_{0.1}Ga_{0.9}N$ (3 nm thick)/ GaN (3 nm thick) and a p-type semiconductor layer 75 of p-type GaN (thickness being 50 nm and doping density $p=2\times10^{17}$ cm$^{-3}$) by MOCVD, forming a current stricture layer 76 of $SiO_2$ on the p-type semiconductor layer 75 by CVD, etching the current structure layer 76 to a striped pattern, forming an n-type semiconductor layer 77 of n-type BeO (thickness being 1 μm and doping density $n=1\times10^{20}$ cm$^{-3}$) on the current structure layer by sputtering, forming a mirror facet by dry-etching and then a metal layer 78 of Au and an n-type electrode 71 by evaporation. A resultant laser has good characteristics of wavelength 420 nm, threshold current density 2 kA/cm$^2$ and operating voltage 10V.

The band energy structure of this LD is shown in FIG. 8. Since the p-type semiconductor layer 75 is as thin as 50 nm, it does not work as a clad layer. Since the n-type semiconductor layer 77 is as thick as 1 μm and its refractive index is smaller than that of the active layer 74, it can work as a clad layer. Light is defined by the n-type clad layer 73 and the n-type semiconductor layer 77 and confined in the active layer 74.

The energy level 22 of the conduction band edge of BeO forming the n-type semiconductor layer 77 is deeper than that 21 of the valence band edge of GaN forming the p-type semiconductor layer 75. Therefore, there is no depletion layer formed in an interface between the p-type semiconductor layer 75 and the n-type semiconductor layer 77 unlike the usual p-n junction, so that no diode characteristics are given thereto. Current can flow easily from the n-type semiconductor layer 77 to the p-type semiconductor layer 75. Holes are injected from the p-type semiconductor layer 75 to the active layer 74 and electrons are injected from the n-type clad layer 73 to the active layer 74. The p-type semiconductor layer 75 functions as a hole injecting layer. On the other hand, since Fermi level 23 of the metal layer 78 is shallower than the level 22 of the conduction band edge of the n-type semiconductor layer 77, a junction between them became ohmic. As a result, it is possible to inject hole and electrons to the active layer 74 by applying a positive potential to the metal layer 78.

Since, in this structure, there is no clad layer, it is possible to reduce the resistance of the element. Further, the resistance of the p-type electrode portion is also small and the operating voltage is also lowered. Since the n-type semiconductor layer 77 can be poly-crystalline, it is possible to substantially improve the yield of the element.

Although, in the fourth embodiment, the n-type semiconductor layer is of n-type BeO, the n-type semiconductor layer may be formed of other semiconductor material such as n-type ZnO. Similarly, although the LD is of GaN, it may be formed of other material such as ZnSe, InGaAlP.

According to the present invention, it is possible to provide a p-type electrode having low resistance and high reliability and a semiconductor light emitting element having low operating voltage and high yield, as described hereinbefore.

What is claimed is:

1. A p-type electrode structure comprising an n-type semiconductor layer and a metal layer sequentially laminated on a p-type semiconductor layer, wherein said n-type semiconductor layer has an energy level of a conduction band edge deeper than that of a valence band edge of said p-type semiconductor layer so that upon forming said electrode structure, said n-type semiconductor layer and said p-type semiconductor layer form a p-n junction without a depletion layer, and said p-type electrode structure is operated by injecting current from said metal layer through said n-type semiconductor layer to said p-type semiconductor layer by applying a positive potential to said metal layer.

2. The p-type electrode structure as claimed in claim 1, wherein said n-type semiconductor layer is formed of a metal oxide.

3. The p-type electrode structure as claimed in claim 2, wherein said p-type semiconductor layer is formed of a material selected from a group consisting of group II-VI wide gap compound semiconductors, group III-V wide gap compound semiconductors, and group IV wide gap compound semiconductors.

4. The p-type electrode structure as claimed in claim 3, wherein said p-type semiconductor layer is formed of a material selected from a group consisting of group II-VI wide gap compound semiconductors, group III-V wide gap compound semiconductors, and group IV wide gap compound semiconductors.

5. The p-type electrode structure as claimed in claim 2, wherein said metal oxide is ZnO or BeO.

6. The p-type electrode structure as claimed in claim 5, wherein said p-type semiconductor layer is formed of a material selected from a group consisting of group II-VI wide gap compound semiconductors, group III-V wide gap compound semiconductors, and group IV wide gap compound semiconductors.

7. The p-type electrode structure as claimed in claim 6, wherein said p-type semiconductor layer is formed of a material selected from a group consisting of group II-VI wide gap compound semiconductors, group III-V wide gap compound semiconductors, and group IV wide gap compound semiconductors.

8. The p-type electrode structure as claimed in claim 1, wherein said p-type semiconductor layer is formed of a material selected from a group consisting of group II-VI wide gap compound semiconductors, group III-V wide gap compound semiconductors, and group IV wide gap compound semiconductors.

9. The p-type electrode structure as claimed in claim 8, wherein said p-type semiconductor layer is formed of a material selected from a group consisting of group II-VI wide gap compound semiconductors, group III-V wide gap compound semiconductors, and group IV wide gap compound semiconductors.

10. A semiconductor light emitting element comprising:
a p-type electrode structure comprising an n-type semiconductor layer and a metal layer sequentially laminated on a p-type semiconductor layer, wherein said n-type semiconductor layer has an energy level of a conduction band edge deeper than that of a valence band edge of said p-type semiconductor layer so that upon forming said electrode structure, said n-type semiconductor layer and said p-type semiconductor layer form a p-n junction without a depletion layer, and said p-type electrode structure is operated by injecting current from said metal layer through said n-type semiconductor layer to said p-type semiconductor layer by applying a positive potential to said metal layer.

11. The semiconductor light emitting element as claimed in claim 10, wherein said semiconductor light emitting element is a semiconductor laser having a p-n junction or a light emitting diode having a p-n junction.

12. The semiconductor light emitting element as claimed in claim 11, wherein said semiconductor laser or said light emitting diode comprises an active layer, an n-type clad layer, a p-type semiconductor layer, an n-type semiconductor layer and the metal layer, said p-type semiconductor layer, said n-type semiconductor layer and said metal layer being formed adjacent to said active layer, a band gap of said p-type semiconductor layer is larger than a band gap of said active layer, said p-type semiconductor layer is thin compared with wavelength of light emitted, energy level of a conduction band edge of said n-type semiconductor layer is deeper than that of a valence band edge of said p-type semiconductor layer and refractive index of said n-type semiconductor layer is smaller than that of said active layer, so that light is confined in said active layer by said n-type clad layer and said n-type semiconductor layer, said semiconductor laser or light emitting diode being operated by injecting holes from said metal layer through said n-type semiconductor layer and said p-type semiconductor layer to said active layer by applying a positive potential to said metal layer.

13. The semiconductor light emitting element as claimed in claim 12, wherein said n-type semiconductor layer is formed of a metal oxide.

14. The semiconductor light emitting element as claimed in claim 13, wherein said metal oxide is ZnO or BeO.

15. The semiconductor light emitting element as claimed in claim 14, wherein said p-type semiconductor layer is formed of a material selected from a group consisting of group II-VI wide gap compound semiconductors, group III-V wide gap compound semiconductors, and group IV wide gap compound semiconductors.

16. The semiconductor light emitting element as claimed in claim 15, wherein said group II-VI wide gap compound semiconductors include ZnSe, ZnSSe and MgSSe, said group III-V wide gap compound semiconductors include GaN, AlGaN, InGaN, InGaP and InAlP, and said group IV wide gap compound semiconductors include SiC and C.

17. The semiconductor light emitting element as claimed in claim 13, wherein said p-type semiconductor layer is formed of a material selected from a group consisting of group II-VI wide gap compound semiconductors, group III-V wide gap compound semiconductors, and group IV wide gap compound semiconductors.

18. The semiconductor light emitting element as claimed in claim 17, wherein said group II-VI wide gap compound semiconductors include ZnSe, ZnSSe and MgSSe, said group III-V wide gap compound semiconductors include GaN, AlGaN, InGaN, InGaP and InAlP, and said group IV wide gap compound semiconductors include SiC and C.

19. The semiconductor light emitting element as claimed in claim 11, wherein said n-type semiconductor layer is formed of a metal oxide.

20. The semiconductor light emitting element as claimed in claim 19, wherein said metal oxide is ZnO or BeO.

21. The semiconductor light emitting element as claimed in claim 20, wherein said p-type semiconductor layer is formed of a material selected from a group consisting of group II-VI wide gap compound semiconductors, group III-V wide gap compound semiconductors, and group IV wide gap compound semiconductors.

22. The semiconductor light emitting element as claimed in claim 21, wherein said group II-VI wide gap compound semiconductors include ZnSe, ZnSSe and MgSSe, said group III-V wide gap compound semiconductors include GaN, AlGaN, InGaN, InGaP and InAlP, and said group IV wide gap compound semiconductors include SiC and C.

23. The semiconductor light emitting element as claimed in claim 19, wherein said p-type semiconductor layer is formed of a material selected from a group consisting of group II-VI wide gap compound semiconductors, group III-V wide gap compound semiconductors, and group IV wide gap compound semiconductors.

24. The semiconductor light emitting element as claimed in claim 23, wherein said p-type semiconductor layer is formed of a material selected from a group consisting of group II-VI wide gap compound semiconductors, group III-V wide gap compound semiconductors, and group IV wide gap compound semiconductors.

25. The semiconductor light emitting element as claimed in claim 10, wherein said semiconductor laser or said light emitting diode comprises an active layer, an n-type clad layer, a p-type semiconductor layer, an n-type semiconductor layer and the metal layer, said p-type semiconductor layer, said n-type semiconductor layer and said metal layer being formed adjacent to said active layer, a band gap of said p-type semiconductor layer is larger than a band gap of said active layer, said p-type semiconductor layer is thin compared with wavelength of light emitted, energy level of a conduction band edge of said n-type semiconductor layer is deeper than that of a valence band edge of said p-type semiconductor layer and refractive index of said n-type semiconductor layer is smaller than that of said active layer, so that light is confined in said active layer by said n-type clad layer and said n-type semiconductor layer, said semiconductor laser or light emitting diode being operated by injecting holes from said metal layer through said n-type semiconductor layer and said p-type semiconductor layer to said active layer by applying a positive potential to said metal layer.

26. The semiconductor light emitting element as claimed in claim 25, wherein said n-type semiconductor layer is formed of a metal oxide.

27. The semiconductor light emitting element as claimed in claim 26, wherein said metal oxide is ZnO or BeO.

28. The semiconductor light emitting element as claimed in claim 27, wherein said p-type semiconductor layer is formed of a material selected from a group consisting of group II-VI wide gap compound semiconductors, group III-V wide gap compound semiconductors, and group IV wide gap compound semiconductors.

29. The semiconductor light emitting element as claimed in claim 28, wherein said group II-VI wide gap compound semiconductors include ZnSe, ZnSSe and MgSSe, said group III-V wide gap compound semiconductors include GaN, AlGaN, InGaN, InGaP and InAlP, and said group IV wide gap compound semiconductors include SiC and C.

30. The semiconductor light emitting element as claimed in claim 26, wherein said p-type semiconductor layer is formed of a material selected from a group consisting of group II-VI wide gap compound semiconductors, group III-V wide gap compound semiconductors, and group IV wide gap compound semiconductors.

31. The semiconductor light emitting element as claimed in claim 30, wherein said group II-VI wide gap compound semiconductors include ZnSe, ZnSSe and MgSSe, said group III-V wide gap compound semiconductors include GaN, AlGaN, InGaN, InGaP and InAlP, and said group IV wide gap compound semiconductors include SiC and C.

32. The semiconductor light emitting element as claimed in claim 10, wherein said n-type semiconductor layer is formed of a metal oxide.

33. The semiconductor light emitting element as claimed in claim 32, wherein said metal oxide is ZnO or BeO.

34. The semiconductor light emitting element as claimed in claim 33, wherein said p-type semiconductor layer is formed of a material selected from a group consisting of group II-VI wide gap compound semiconductors, group III-V wide gap compound semiconductors, and group IV wide gap compound semiconductors.

35. The semiconductor light emitting element as claimed in claim 34, wherein said group II-VI wide gap compound semiconductors include ZnSe, ZnSSe and MgSSe, said group III-V wide gap compound semiconductors include GaN, AlGaN, InGaN, InGaP and InAlP, and said group IV wide gap compound semiconductors include SiC and C.

36. The semiconductor light emitting element as claimed in claim 32, wherein said p-type semiconductor layer is formed of a material selected from a group consisting of group II-VI wide gap compound semiconductors, group III-V wide gap compound semiconductors, and group IV wide gap compound semiconductors.

37. The semiconductor light emitting element as claimed in claim 36, wherein said p-type semiconductor layer is formed of a material selected from a group consisting of group II-VI wide gap compound semiconductors, group III-V wide gap compound semiconductors, and group IV wide gap compound semiconductors.

* * * * *